(12) United States Patent
Mate et al.

(10) Patent No.: US 8,078,165 B2
(45) Date of Patent: Dec. 13, 2011

(54) CONFIGURING PREFERRED USER ZONE LISTS FOR PRIVATE ACCESS POINTS FOR WIRELESS NETWORKING

(75) Inventors: Amit Mate, Chelmsford, MA (US); Shi Baw Ch'ng, North Billerica, MA (US); Paul D'Arcy, Chelmsford, MA (US); Satish Ananthaiyer, Tewksbury, MA (US)

(73) Assignee: Airvana, Corp., Chelmsford, MA (US)

( * ) Notice: Subject to any disclaimer, the term of this patent is extended or adjusted under 35 U.S.C. 154(b) by 0 days.

(21) Appl. No.: 11/640,503

(22) Filed: Dec. 15, 2006

(65) Prior Publication Data
US 2008/0076398 A1     Mar. 27, 2008

Related U.S. Application Data

(60) Provisional application No. 60/824,877, filed on Sep. 7, 2006.

(51) Int. Cl.
*H04Q 7/20* (2006.01)
(52) U.S. Cl. .................. 455/432.1; 455/452.1; 455/41.2; 455/450; 455/436; 455/404.2; 455/456.3; 455/414.4
(58) Field of Classification Search ............... 455/432.3, 455/450, 456.3, 432.1, 436, 404.2, 452.1, 455/41.2
See application file for complete search history.

(56) References Cited

U.S. PATENT DOCUMENTS

| | | | |
|---|---|---|---|
| 5,623,495 A | 4/1997 | Eng et al. | |
| 6,163,524 A | 12/2000 | Magnusson et al. | |
| 6,208,873 B1 | 3/2001 | Black et al. | |
| 6,233,231 B1 | 5/2001 | Felix et al. | |
| 6,272,122 B1 | 8/2001 | Wee | |
| 6,301,484 B1 | 10/2001 | Rogers et al. | |
| 6,317,452 B1 | 11/2001 | Durrant et al. | |
| 6,400,755 B1 | 6/2002 | Harris et al. | |
| 6,560,194 B1 | 5/2003 | Gourgue et al. | |
| 6,597,677 B1 | 7/2003 | Segawa | |
| 6,615,038 B1 | 9/2003 | Moles et al. | |
| 6,711,144 B1 | 3/2004 | Kim et al. | |
| 6,731,618 B1 | 5/2004 | Chung et al. | |
| 6,741,862 B2 | 5/2004 | Chung et al. | |

(Continued)

FOREIGN PATENT DOCUMENTS

CN     101536587 A     9/2009

(Continued)

OTHER PUBLICATIONS

U.S. Appl. No. 60/824,877, filed Sep. 7, 2006.

(Continued)

*Primary Examiner* — Charles Appiah
*Assistant Examiner* — Randy Peaches
(74) *Attorney, Agent, or Firm* — Fish & Richardson P.C.

(57) ABSTRACT

Information is received identifying a geographic location of an access point in a radio access network. Access information is assigned and communicated to the access point, and the access information and the geographic location information is communicated to an access terminal. The access terminal identifies the access point as a preferred access point, including its geographic location. The access terminal receives information identifying its own geographic location, and when the access terminal is near the access point, the access point is used to access the network. The access point receives information identifying its geographic location and communicates the geographic location information to a configuration server. The access point receives access information from the configuration server and provides access terminals access to the network using the access information.

37 Claims, 5 Drawing Sheets

U.S. PATENT DOCUMENTS

| | | | |
|---|---|---|---|
| 6,781,999 | B2 | 8/2004 | Eyuboglu et al. |
| 6,876,690 | B1 | 4/2005 | Imbeni et al. |
| 7,170,871 | B2 | 1/2007 | Eyuboglu et al. |
| 7,200,391 | B2 | 4/2007 | Chung et al. |
| 7,242,958 | B2 | 7/2007 | Chung et al. |
| 7,277,446 | B1 | 10/2007 | Abi-Nassif et al. |
| 7,299,278 | B2 | 11/2007 | Ch'ng |
| 2002/0051437 | A1 | 5/2002 | Take |
| 2002/0167907 | A1 | 11/2002 | Sarkar et al. |
| 2002/0196749 | A1 | 12/2002 | Eyuboglu et al. |
| 2003/0026225 | A1 | 2/2003 | Ogino et al. |
| 2003/0065805 | A1 | 4/2003 | Barnes, Jr. |
| 2003/0100311 | A1 | 5/2003 | Chung et al. |
| 2003/0114180 | A1 | 6/2003 | Black et al. |
| 2004/0076120 | A1 | 4/2004 | Ishidoshiro |
| 2004/0081134 | A1 | 4/2004 | Kotzin |
| 2004/0081144 | A1 | 4/2004 | Martin et al. |
| 2004/0177270 | A1 | 9/2004 | Little et al. |
| 2005/0026640 | A1 | 2/2005 | Pan |
| 2005/0136949 | A1 | 6/2005 | Barnes, Jr. |
| 2005/0213555 | A1 | 9/2005 | Eyuboglu et al. |
| 2005/0232242 | A1 | 10/2005 | Karaoguz et al. |
| 2005/0243749 | A1 | 11/2005 | Mehrabanzad et al. |
| 2005/0245279 | A1 | 11/2005 | Mehrabanzad et al. |
| 2006/0067422 | A1 | 3/2006 | Chung |
| 2006/0067451 | A1 | 3/2006 | Pollman et al. |
| 2006/0126509 | A1 | 6/2006 | Abi-Nassif |
| 2006/0159045 | A1 | 7/2006 | Ananthaiyer et al. |
| 2006/0179322 | A1 | 8/2006 | Bennett et al. |
| 2006/0203746 | A1 | 9/2006 | Maggenti et al. |
| 2006/0209721 | A1 | 9/2006 | Mese et al. |
| 2006/0240782 | A1 | 10/2006 | Pollman et al. |
| 2006/0291420 | A1 | 12/2006 | Ng |
| 2006/0294241 | A1 | 12/2006 | Cherian et al. |
| 2007/0010261 | A1* | 1/2007 | Dravida et al. ............ 455/456.3 |
| 2007/0026884 | A1 | 2/2007 | Rao |
| 2007/0058628 | A1 | 3/2007 | Rao et al. |
| 2007/0077948 | A1 | 4/2007 | Sharma et al. |
| 2007/0097916 | A1 | 5/2007 | Eyuboglu et al. |
| 2007/0115896 | A1 | 5/2007 | To et al. |
| 2007/0140163 | A1* | 6/2007 | Meier et al. .................... 370/329 |
| 2007/0140172 | A1 | 6/2007 | Garg et al. |
| 2007/0140184 | A1 | 6/2007 | Garg et al. |
| 2007/0140185 | A1 | 6/2007 | Garg et al. |
| 2007/0140218 | A1 | 6/2007 | Nair et al. |
| 2007/0155329 | A1 | 7/2007 | Mehrabanzad et al. |
| 2007/0213049 | A1* | 9/2007 | Bishop ....................... 455/432.3 |
| 2007/0220573 | A1 | 9/2007 | Chiussi et al. |
| 2007/0230392 | A1 | 10/2007 | Adams et al. |
| 2007/0230419 | A1 | 10/2007 | Raman et al. |
| 2007/0238442 | A1 | 10/2007 | Mate et al. |
| 2007/0238476 | A1 | 10/2007 | Raman et al. |
| 2007/0242648 | A1 | 10/2007 | Garg et al. |
| 2007/0248042 | A1 | 10/2007 | Harikumar et al. |
| 2007/0265013 | A1* | 11/2007 | Labedz ........................ 455/450 |
| 2008/0003988 | A1 | 1/2008 | Richardson |
| 2008/0013488 | A1 | 1/2008 | Garg et al. |
| 2008/0062925 | A1 | 3/2008 | Mate et al. |
| 2008/0065752 | A1 | 3/2008 | Ch'ng et al. |
| 2008/0069020 | A1 | 3/2008 | Richardson |
| 2008/0069028 | A1 | 3/2008 | Richardson |
| 2008/0076398 | A1 | 3/2008 | Mate et al. |
| 2008/0117842 | A1 | 5/2008 | Rao |
| 2008/0119172 | A1 | 5/2008 | Rao et al. |
| 2008/0120417 | A1 | 5/2008 | Harikumar et al. |
| 2008/0139203 | A1 | 6/2008 | Ng et al. |
| 2008/0146232 | A1 | 6/2008 | Knisely |
| 2008/0151843 | A1 | 6/2008 | Valmikam et al. |
| 2008/0159236 | A1 | 7/2008 | Ch'ng et al. |
| 2008/0162924 | A1 | 7/2008 | Chinitz et al. |
| 2008/0162926 | A1 | 7/2008 | Xiong et al. |

FOREIGN PATENT DOCUMENTS

| | | |
|---|---|---|
| EP | 907263 | 4/1999 |
| EP | 2 046 084 A1 | 4/2009 |
| GB | 2456090 | 7/2009 |
| GB | 2456694 A8 | 7/2009 |
| WO | WO98/49844 | 11/1998 |
| WO | WO2007/008574 | 1/2007 |
| WO | WO2008/030933 | 3/2008 |
| WO | WO2008/030934 | 3/2008 |
| WO | WO2008/030956 | 3/2008 |
| WO | WO2008/082985 | 7/2008 |

OTHER PUBLICATIONS

U.S. Appl. No. 11/640,415, filed Dec. 15, 2006.
PCT application No. PCT/US2007/77725 filed on Sep. 6, 2007, with Publication No. WO2008/030934.
International Search Report and Written Opinion from related U.S. Appl. No. 11/640,415 with corresponding PCT application No. PCT/US2007/77725, Patent Cooperation Treaty, mailed Mar. 20, 2008, 14 pages.
U.S. Appl. No. 11/640,501, filed on Dec. 15, 2006.
PCT application No. PCT/US2007/77722 filed on Sep. 6, 2007, with Publication No. WO2008/030933.
International Search Report and Written Opinion from related U.S. Appl. No. 11/640,501 with corresponding PCT application No. PCT/US2007/77722, mailed on May 5, 2008, 44 pages.
Kramer et al., "Building and Measuring a High Performance Network Architecture," Apr. 20, 2001, pp. 31, LBNL Technical Report No. LBNL 47274:WTCK.
PCT application No. PCT/US2007/077755 filed on Sep. 6, 2007, with Publication No. WO2008/030956.
International Search Report and Written Opinion mailed Dec. 19, 2008 from corresponding PCT application No. PCT/US2007/77755 (12 pages).
International Preliminary Report on Patentability from PCT application No. PCT/US2007/077725 mailed Mar. 19, 2009 (11 pages).
International Preliminary Report on Patentability from PCT application No. PCT/US2007/077722 mailed Mar. 19, 2009 (11 pages).
International Preliminary Report on Patentability from PCT application No. PCT/US2007/077755 mailed Mar. 19, 2009 (8 pages).
International Search Report and Written Opinion mailed Jun. 3, 2008 from PCT application No. PCT/US2007/088112 (13 pages).
3$^{rd}$ Generation Partnership Project "3GPP2", "cdma2000 High Rate Packet Data Air Interface Specification", TIA/EIA/IS-856, C.S0024, version 4.0, Oct. 25, 2002 (548 pages).
3rd Generation Partnership Project "3GPP2", "cdma2000 High Rate Data Air Interface Specification", TIA/EIA/IS-856, C.S0024-A, version 2.0, Jul. 2005 (1227 pages).
3rd Generation Partnership Project "3GPP2", "cdma2000 High Rate Data Air Interface Specification", TIA/EIA/IS-856, C.S0024-B, version 1.0, Apr. 2006 (1623 pages).
Office action from U.S. Appl. No. 11/640,415 mailed May 14, 2009.
International Preliminary Report on Patentability from PCT application No. PCT/US2007/088112 mailed Jul. 9, 2009 (7 pages).
Office action and response history of U.S. Appl. No. 11/640,415 to Oct. 9, 2009.
Examination Report for GB Application No. 0905846.2 mailed Sep. 10, 2009 (2 pages).
Office action and response history of U.S. Appl. No. 11/640,501 to Oct. 22, 2009.
Office action and response history of U.S. Appl. No. 11/617,298 to Nov. 5, 2009.
Office action and response history of U.S. Appl. No. 11/640,415 to Dec. 17, 2009.
Response filed in GB Application No. 0905846.2 filed on Jan. 8, 2010.
Office action and response history of U.S. Appl. No. 11/640,501 to Jan. 20, 2010.
Office action and response history of U.S. Appl. No. 11/640,415 to Apr. 29, 2010.
Office action and response history of U.S. Appl. No. 11/640,501 to Apr. 27, 2010.
Office action and response history of U.S. Application No. 11/617,298 to Mar. 3, 2010.
Office action and response history of U.S. Appl. No. 11/640,415 to Jul. 26, 2010.
Office action and response history of U.S. Appl. No. 11/617,298 to Jul. 15, 2010.

Fish & Richardson P.C., Response to Final Office action mailed Apr. 27, 2010 in U.S. Appl. No. 11/640,501, filed Jul. 27, 2010, 21 pages.
Examination Report issued Jul. 26, 2010 from United Kingdom patent application No. GB0905844.7, 2 pages.
U.S. Randy Peaches, USPTO Non Final Office Action in U.S. Appl. No. 11/640,415, dated Oct. 5, 2010, 34 pages.
U.S. Randy Peaches, USPTO Non Final Office Action in U.S. Appl. No. 11/640,501, dated Oct. 7, 2010, 52 pages.
Fish & Richardson P.C., Response to Final Office action mailed Jul. 15, 2010 in U.S. Appl. No. 11/617,298, filed Oct. 15, 2010, 14 pages.
Fish & Richardson P.C., Response to Non Final Office action mailed Oct. 7, 2010 in U.S. Appl. No. 11/640,501, filed Jan. 7, 2011, 21 pages.
Harry Newton, Newton's Telecom Dictionary, Mar. 2007, Flatrion Publishing, 23$^{rd}$, p. 1006.
USPTO Non Final Office Action in U.S. Appl. No. 11/617,298, dated Jan. 18, 2011, 16 pages.
Fish & Richardson P.C., Response to Non Final Office action mailed Oct. 5, 2010 in U.S. Appl. No. 11/640,415, filed Feb. 7, 2011, 23 pages.
USPTO Non Final Office Action in U.S. Appl. No. 11/640,501, dated Mar. 30, 2011, 51 pages.
Fish & Richardson P.C., Response to Non Final Office action mailed Jan. 18, 2011 in U.S. Appl. No. 11/617,298, filed Apr. 18, 2011, 10 pages.
USPTO Final Office Action in U.S. Appl. No. 11/640,415, dated Apr. 19, 2011, 38 pages.
USPTO Final Office Action in U.S. Appl. No. 11/617,298, dated Jun. 23, 2011, 14 pages.

* cited by examiner

US 8,078,165 B2

CONFIGURING PREFERRED USER ZONE LISTS FOR PRIVATE ACCESS POINTS FOR WIRELESS NETWORKING

CLAIM OF PRIORITY

This application claims priority under 35 USC §119(e) to U.S. Patent Application Ser. No. 60/824,877, filed on Sep. 7, 2006, the entire contents of which are hereby incorporated by reference.

BACKGROUND

This description relates to configuring preferred user zone lists for private access points for wireless networking.

Cellular wireless communications systems are designed to serve many access terminals distributed in a large geographic area by dividing the area into cells, as shown in FIG. 1. At or near the center of each cell 102, 104, 106, a radio network access point 108, 110, 112, also referred to as a base transceiver station (BTS), is located to serve access terminals 114, 116 (e.g., cellular telephones, laptops, PDAs) located in the cell. Each cell is often further divided into sectors 102a-c, 104a-c, 106a-c by using multiple sectorized antennas. In each cell, that cell's radio network access point may serve one or more sectors and may communicate with multiple access terminals in its cell.

The 1xEV-DO protocol has been standardized by the Telecommunication Industry Association (TIA) as TIA/EIA/IS-856, "CDMA2000 High Rate Packet Data Air Interface Specification," 3GPP2 C.S0024-0, Version 4.0, Oct. 25, 2002, which is incorporated herein by reference. Revision A to this specification has been published as TIA/EIA/IS-856A, "CDMA2000 High Rate Packet Data Air Interface Specification," 3GPP2 C.S0024-A, Version 2.0, July 2005. Revision A is also incorporated herein by reference. Revision B to this specification has been published as TIA/EIA/IS-856-B, 3GPP2 C.S0024-B, version 1.0, May 2006, and is also incorporated herein by reference. Other wireless communication protocols may also be used.

When connecting to a radio network, an access terminal selects an access point from a list of available radio network access points that are known to be within communication range. In conventional systems, the access terminal obtains the list of available access points from "neighbor list information." In general, neighbor list information includes the set of radio channels (e.g., radio access technology, band classes, frequencies, and channel bandwidths) and other necessary information (such as timing offsets, coding information, details about the particular radio technology in that channel, search window size, etc.) to assist the access terminal in locating radio network access points from which it can potentially receive radio services.

Neighbor list information is typically provided to the access terminal via (1) a preconfigured database programmed into the access terminal in a static or semi-static (infrequently updated) state or (2) overhead signaling messages that are transmitted by some or all of the radio network access points located within the general vicinity of the access terminal. These mechanisms for providing neighbor list information to an access terminal are generally implemented on static radio access networks in which the locations of radio network access points are either permanently fixed or changed infrequently.

SUMMARY

In general, in one aspect, on a portable access terminal, a first access point is identified as a preferred access point, a geographic location is associated with the first access point, information identifying a geographic location of the access terminal is received, and when the access terminal is near the first access point, the first access point is used to access a radio access network.

Implementations may include one or more of the following features. Identifying the access point as a preferred access point includes receiving an instruction to add the access point to a list of preferred access points. Associating the geographic location with the first access point includes receiving information identifying geographic location information of the first access point as part of the instruction to add the access point to the list of preferred access points. The instruction is received from an OTAPA server or an OTASP server. The information identifying the geographic location of the access terminal includes GPS coordinates of the access terminal. receiving the information identifying the geographic location of the access terminal coordinates includes receiving longitude and latitude coordinates from a GPS satellite or beacon. Receiving the information identifying the geographic location of the access terminal coordinates includes determining longitude and latitude coordinates from a second access point. Receiving the information identifying the geographic location of the access terminal coordinates includes receiving identifying information from a transmitting device and correlating the identifying information to a geographic location.

In general, in one aspect, on an access point, information is received identifying a geographic location of the access point, the geographic location information is communicated to a configuration server, access information is received from the configuration server, and access terminals are provided access to a radio access network using the access information.

Implementations may include one or more of the following features. Access terminal authentication information is received from the configuration server. After moving to a new geographic location, information identifying the new geographic location is received, the new geographic location information is communicated to the configuration server, new access information is received from the configuration server, and access terminals are provided access to the radio access network using the new access information. The configuration server includes a plurality of servers.

In general, in one aspect, information is received identifying a geographic location of an access point in a radio access network, access information is assigned and communicated to the access point, and the access information and the geographic location information is communicated to an access terminal.

Implementations may include one or more of the following features. Communicating the set of network parameters to the access point includes causing a configuration server to communicate the access information to the access terminal using a backhaul network. Communicating the access information and the geographic location information to an access terminal includes causing an OTAPA server or an OTASP server to communicate the access information and the geographic location information to the access terminal using the radio access network. Information is received identifying a new geographic location of the access point, new access information is assigned and communicated to the access point, and the new access information and the new geographic location information is communicated to the access terminal.

These and other aspects and features and various combinations of them may be expressed as methods, apparatus, systems, means for performing functions, program products, and in other ways. A fast transfer to the appropriate access point helps conserve battery life in the access terminal.

Other features and advantages will be apparent from the description a the claims.

DETAILED DESCRIPTION

Figure 1:
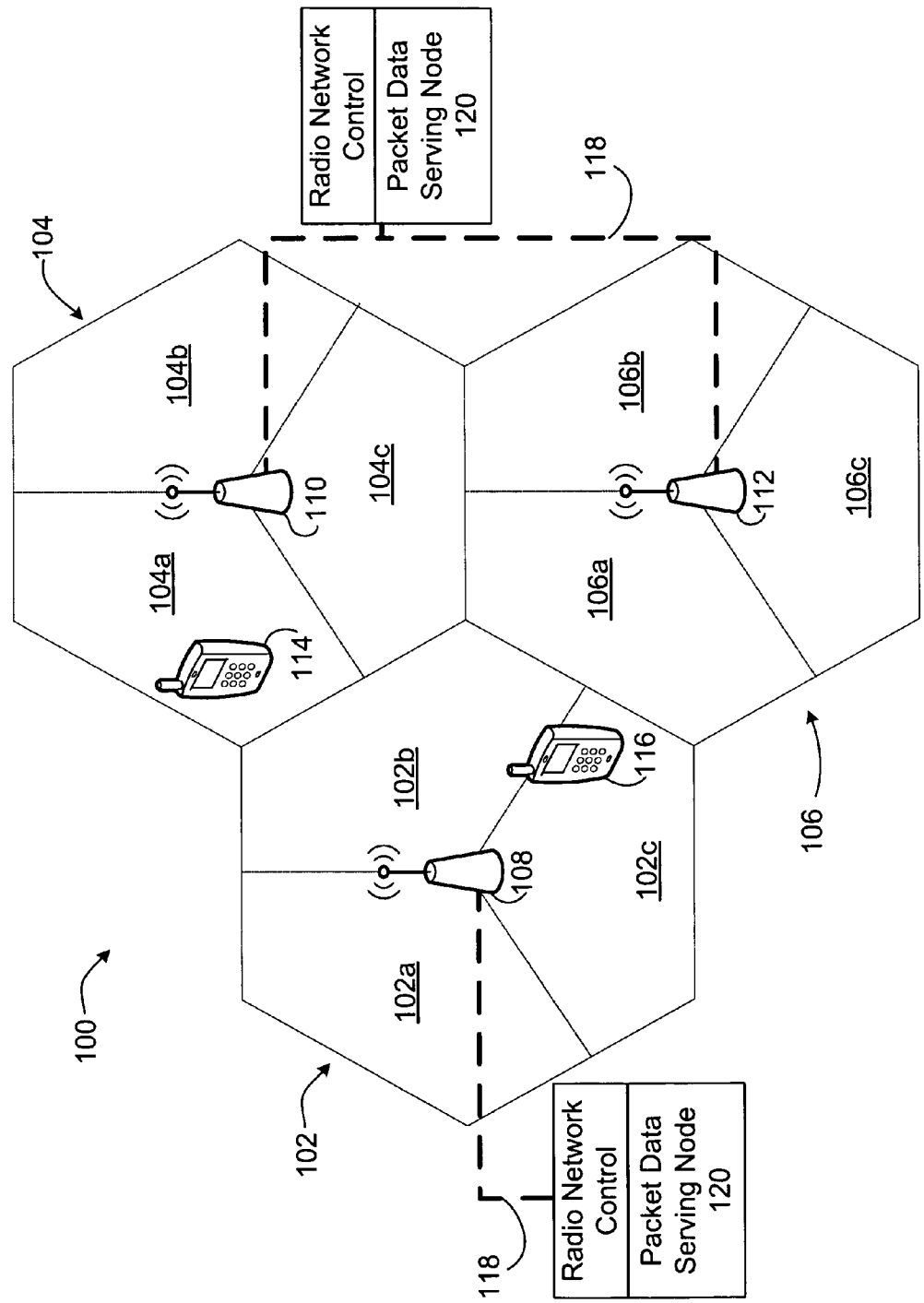
FIG. 1 is a block diagram of a radio access network.

Referring to FIG. 1, a radio access network (RAN) 100 uses an Ev-DO protocol to transmit data packets between an access terminal, e.g., access terminal 114 and 116, and a radio network access point, e.g., access points 108, 110, 112. The access points are connected over a backhaul connection 118 to radio network control/packet data serving nodes (RNC/PDSN) 120, which may be one or more physical devices at different locations.

Figure 2:
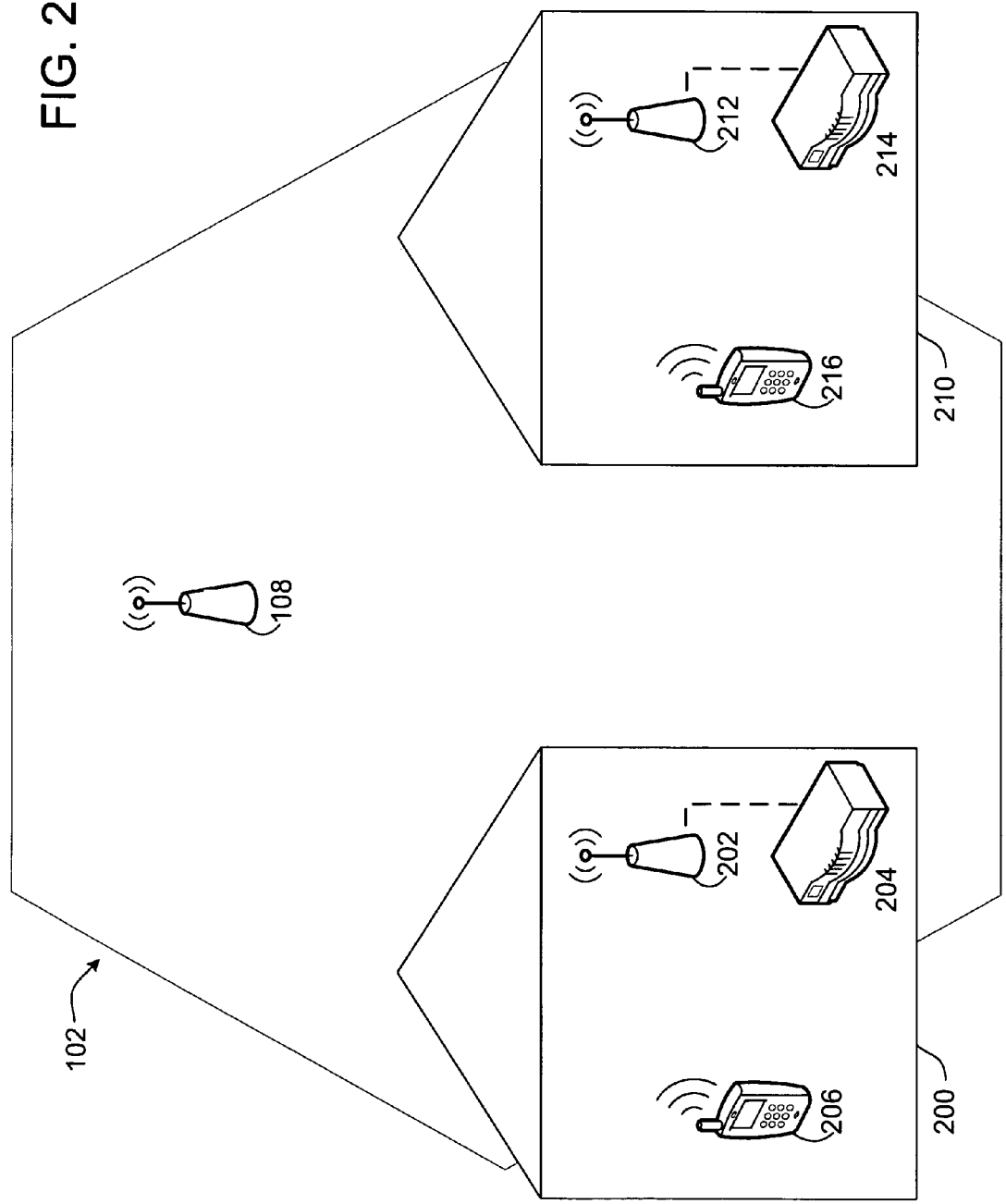
FIG. 2 is a block diagram of a home networking deployment.

In some examples, as shown in FIG. 2, a radio network access point 202 may be deployed in a user's home 200 in the same manner as a WiFi® access point. Such a radio network access point is referred to as a private access point. The private access point 202 may use any available high-speed internet connection, such as DSL or cable modem 204, as the backhaul with the RNC/PDSN functionality implemented in the private access point 202. Such a private access point may be installed anywhere that it is advantageous to do so, for example, in an office, a public space, or a restaurant. When this description refers to a private access point being in a "home" that encompasses any such location. A private access point is different from a picocell access point in that it may be intended to only provide access for the user that installs it in his home or those he authorizes, as opposed to a picocell which may serve a similar venue but provides access to any subscriber of the network. In some examples, a private access point may be integrated into a cable modem or other network hardware, such as a router or WiFi access point.

When an authorized access terminal 206 is present inside the home (or anywhere within range of the private access point 202), it uses the private access point 202 rather than a regular cellular radio network access point such as access point 108 to place or receive voice calls and data connections, even if it is otherwise within the cell 102 for that access point 108. We sometimes refer to the standard access point 108 as a macro access point or macro BTS to distinguish it from a private access point, as it provides direct access to the wider RAN. A neighboring home 210 may have its own private access point 112 connected to its cable modem 214 for use by its owner's access terminal 216. A private access point deployment is different than traditional radio network deployment because neighboring private access points are intended to operate independently, in part because real-time communications is difficult between neighboring private access points. The intended private access point deployment is also different than WiFi deployment in that it is intended to operate in licensed spectrum. Some details and examples are discussed in co-pending application Ser. No. 11/640,415, titled Controlling Reverse Link Interference in Private Access Points for Wireless Networking, filed Dec. 15, 2006, and application Ser. No. 11/640,501, titled Provisioning Private Access Points for Wireless Networking, filed Dec. 15, 2006, which are incorporated here by reference.

Access lists of authorized access terminals for each private access point can be configured on a central server and distributed to the private access points. Information to locate and access the private access points can be distributed to access terminals using an over-the-air parameter administration (OTAPA) system. Access terminals may also retrieve access information from the configuration server themselves. A mobile internet protocol (mobile IP) can be used along with voice call continuity (VCC) for handoffs between private access points. Although this description uses terminology from EV-DO standards, the same concepts are applicable to other communication methods, including GSM, UMTS, HSDPA, WiMax, WiBro, WiFi, and the like. For example, when we refer to a reverse power control (RPC) signal, this should be taken to refer to any signal used by a base station to control power levels of an access terminal.

Preferred User Zone Lists

An EV-DO network using private access points is different than a traditional EV-DO deployment because each private access point has its own access list, i.e., a list of subscribers (or their access terminals) who are authorized to access service through it. We refer to a private access point on which a given access terminal is authorized as an authorized private access point. An access terminal may be described as "provisioned" to a given access point, meaning that it is assigned to use that access point, at least for the time-being. Millions of private access points are contemplated to be deployed in a city. In order to ensure that access terminals attempt to access only on the access point for which they are authorized and that an access terminal's search for access points is efficient, techniques for configuring preferred user zone linsts for private access points may be implemented.

In some examples, an authorized private access point can be configured on the access terminal, including adding, deleting, and reconfiguring authorized private access points. The access terminal can be configured to transfer from the macro access point to the private access point as soon as such a transfer is possible. Among other things, a fast transfer helps conserve battery life in the access terminal.

In some examples, a custom application on a handset-type access terminal is used to manage a private access point list. The application may be implemented in BREW or any other suitable framework for running applications on mobile devices. Similarly, an application written for a host PC's operating system can be used to configure an access terminal that is implemented as a peripheral for or integrated into a PC. The application can have an additional user interface for searching for private access points. In some examples, this is accomplished though application programming interfaces (APIs) (e.g., to trigger search) exposed by handset makers to application vendors. In some examples, an appropriate application is bundled with each access terminal that is expected to use a private access point. In some examples, this approach identifies a private access point by a PNOffset/RFFreq/SectorId triplet, which requires the handset to search for a pilot signal having the designated PNOffset and also to go through a location update procedure to uniquely identify the SectorId.

Once an access terminal has accessed a network, it may use a preferred user zone list (PUZL) to locate and use preferred access points. The PUZL provides priority and characteristics of the access points available to the access terminal, and can be configured as defined in "Over-the-Air Service Provisioning of Mobile Stations in Spread Spectrum Systems," published as TIA-683-C, March, 2003, which is incorporated here by reference, including by over-the-air parameter administration (OTAPA) or over-the-air service provisioning (OTASP). In a typical arrangement, when an access terminal establishes a connection to an access point in the macro network, the access point provides the access terminal with a neighbor list, that is, a listing of other access points operating in the same or neighboring areas. The access terminal compares this list to the list of access points in its PUZL, and if it finds any matches, it begins searching for the identified access points.

Under the specifications noted above, configuration of preferred user zones on an access terminal may be based on PN Offset/RF frequency pairs that identify access points. The existing PUZL configuration mechanism can be extended to private access point deployment by configuring a certain private access point as being part of a preferred user zone of an access terminal. This will cause the access terminal to use that private access point when it is available.

The existing PUZL configuration mechanism can be enhanced to address private access point requirements. In addition to their PN Offset/RF Frequency pairs, access points can also be uniquely identified with their geographic location, i.e., their latitude and longitude. (location information is included in the PUZL for uses other than those provided in this description.) This means that a geographic-specific field can be attached to PUZL entries to allow access terminals to determine which access point to communicate with based on the their own physical locations. The geographic-specific field information is used to enable Rev-A handsets to search for and to use their "preferred" private access points based on their location. Preferred user zone search can be location-based to save the handset's battery and enable quick switchover between a macro access point and a private access point. Instead of (or in addition to) comparing the neighbor list received from a macro access point to its PUZL, an access terminal can compare its current longitude and latitude coordinates to the coordinates of the private access points in its PUZL. If it finds that it is within a certain radius of one, it can then search for the pilot signal that private access point, knowing that it is nearby. This offers some advantages over typical setups, where multiple private access points may share PN Offset/RF Frequency pairs, in which case an access terminal may not be certain that a private access point found in the neighbor list of the macro access point is really the one on its PUZL, and may waste energy looking for it. It also relieves the macro access point of needing to be configured with the identifications of all the private access points in the area it covers, a potentially large and variable number.

Access terminals can determine their geographic location in several ways. In some examples, access terminals are equipped to receive signals from global positioning system (GPS) satellites or beacons and determine their location directly. In some examples, macro base stations transmit information describing their own locations and access terminals may make assumptions based on one or more macro base stations' transmissions. Because each macro base station has a finite range, an assumption that an access station has a similar location is generally valid. In some examples, access terminals are equipped with WiFi receivers, and they can use a database that maps WiFi network information, such as the SSID of a network or the IP address of a WiFi access point, to geographic locations. An access point may use the locations of one or more WiFi networks to triangulate its own location.

Figure 3:
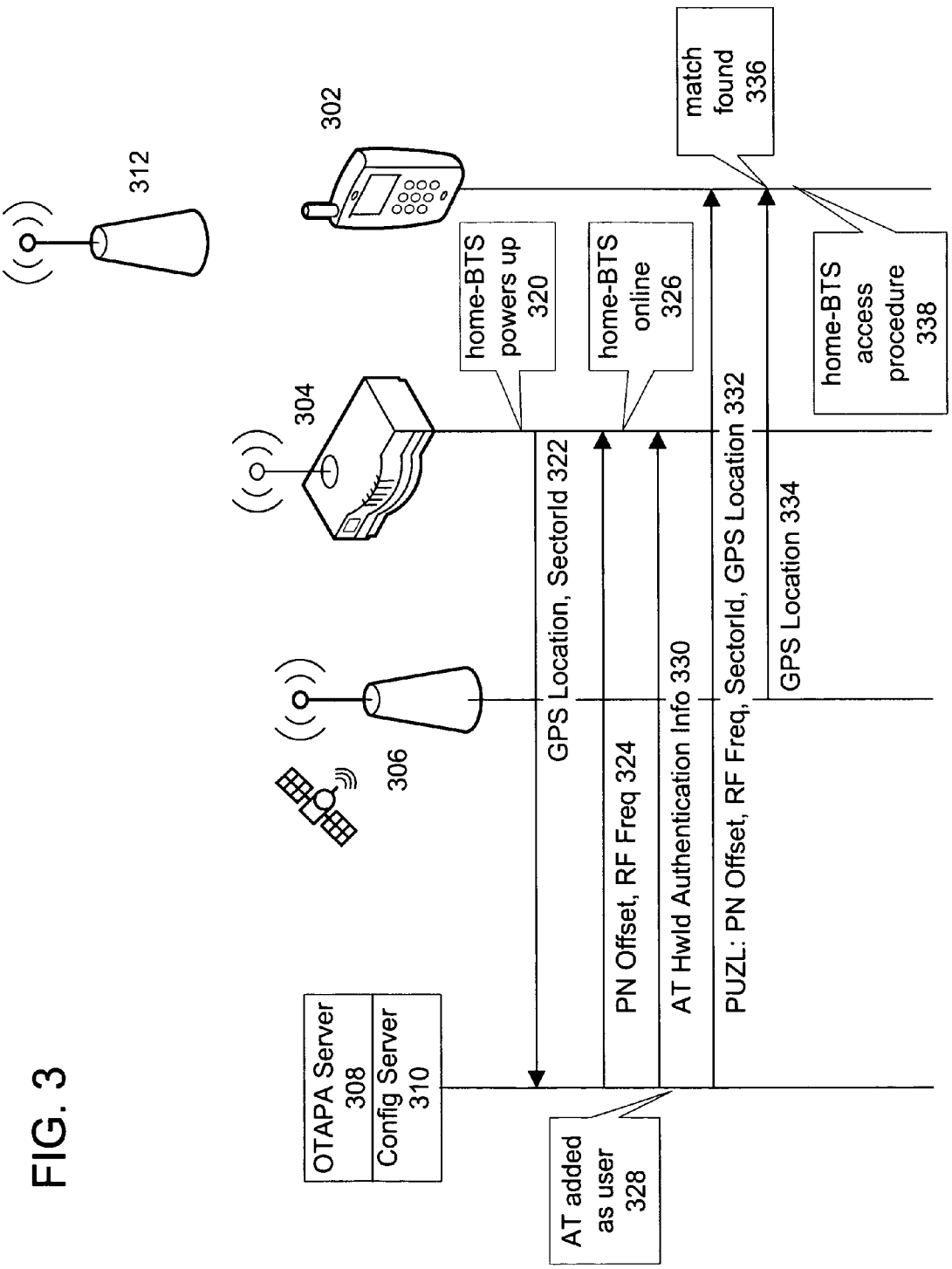
FIG. 3 shows a preferred user zone list configuration and access terminal search mechanism.

The message flow illustrated in FIG. 3 explains the interaction between various network elements and an access terminal 302. As shown, the system can be implemented in several parts. The access terminal 302 will access the network (not shown) through a private access point 304. The access terminal determines its location using geographic coordinates derived from a source 306 of such information as described above. An OTAPA server 308 manages the configuration of the access terminal 302. A configuration server 310 is in communication with the OTAPA server 308 and provides configuration information to the private access point 304.

When the private access point 304 powers up (320), it determines its geographic location and a SectorID 322 from a nearby macro access point 312, and reports these to the configuration server 310. The configuration server 310 assigns the private access point 304 a PN Offset and RF Frequency 324 to use and communicates this and the geographic location and sector ID of the private access point 304 to the OTAPA server. The private access point 304 then comes online (326) using the assigned values. At some point, the access terminal 302 is added (328) as an authorized user on the private access point 304, and the relevant authentication information 330 is communicated to the private access point 304. Provisioning of authorized access terminals can be done in several ways, one of which is discussed in the co-pending service provisioning application mentioned above. After the configuration server 310 reports the private access point 304's current location and configuration information to the OTAPA server 308, the OTAPA server sends this information 332 to the access terminal 302 as an updated entry to its PUZL. Instead of an OTAPA server, the access terminal could get the information from an OTASP server.

As the access terminal 302 moves about, it continually updates its geographic location information based on signals 334 received from the geographic information source 306 and compares its location to the locations of private access points in its PUZL. When its geographic location indicates (336) that it is near a private access point that is on the list (e.g., private access point 304), the access terminal 302 begins searching for that private access point using the PN Offset and RF Frequency pair 324 for that private access point. When it finds it, it initiates an access procedure 338 to log on to the network through that private access point.

Figure 4:
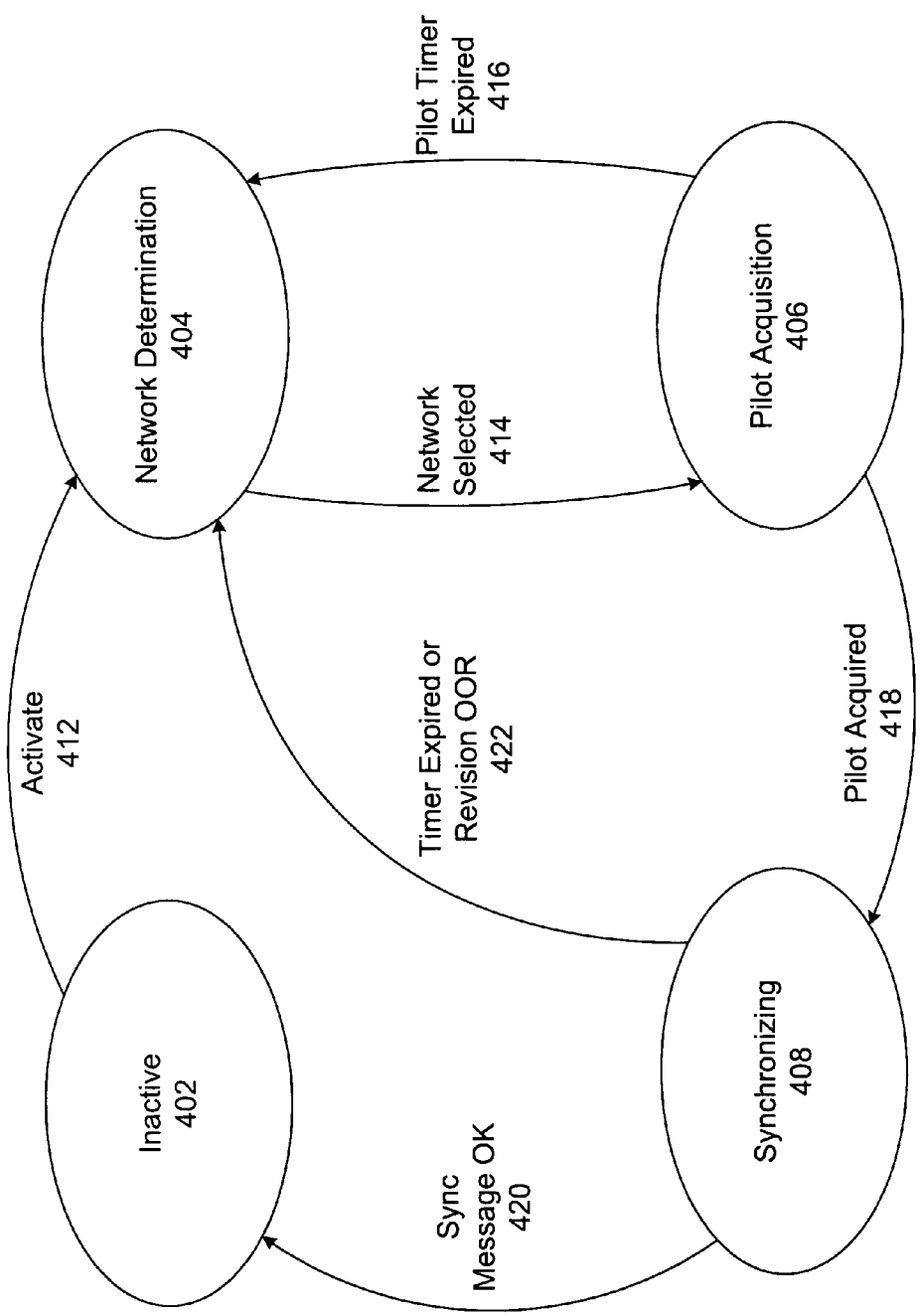
FIGS. 4 and 5 show state diagrams for an access terminal.
Figure 5:
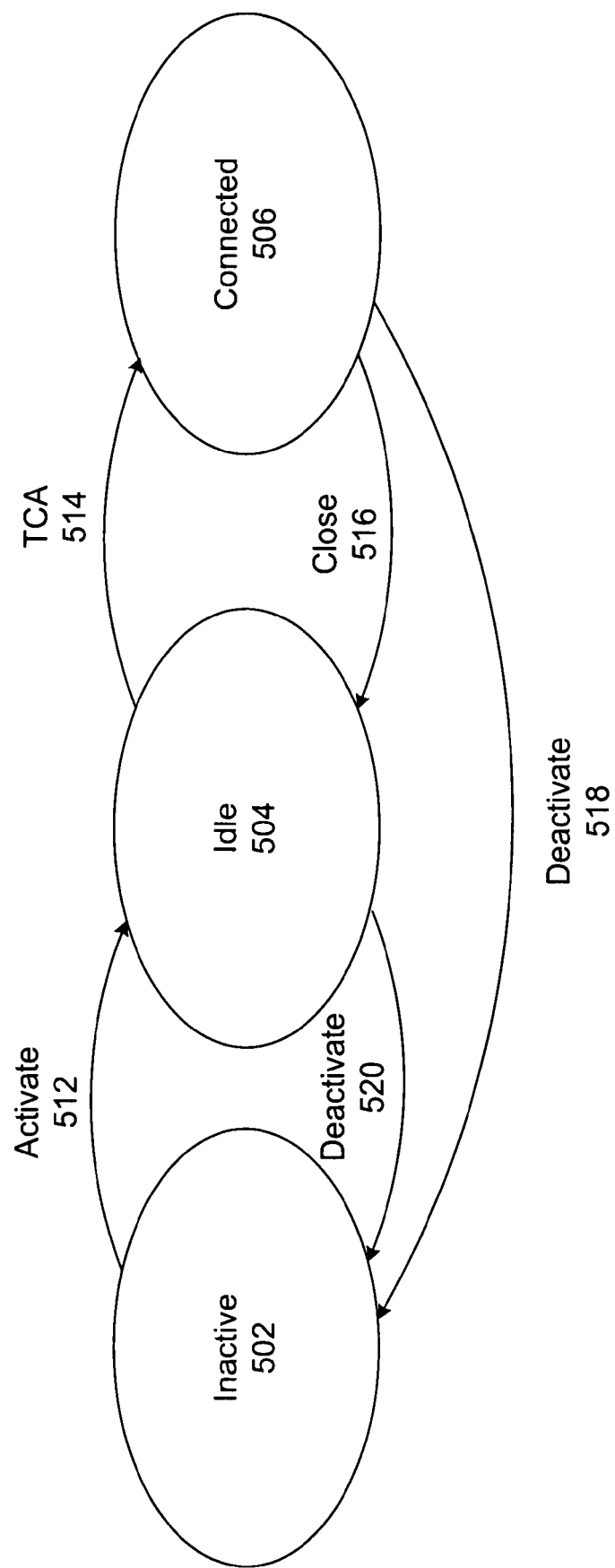

In some examples, the access terminal uses this system as shown in FIGS. 4 and 5. FIG. 4 shows how the access terminal may acquire a pilot signal. In a first state 402, the access terminal is inactive. Upon activating 412, the access terminal enters a network determination state 404. If the activation was triggered because the access terminal detected a strong pilot signal from a private access point or an access point in its PUZL, and the access terminal is close enough, the access terminal uses the PUZL channel record upon entering the network determination state 404. Whether the access terminal is "close enough" is determined based on the access terminal's location, which it determines as described above, and on the private access point's location, recorded in the PUZL, also described above. The PUZL also includes a radius which is compared to the difference in the locations to determine whether the access terminal is within the radius and therefore close enough to use that private access point. From the network determination state 404, a network is selected 414 and the access terminal enters a pilot acquisition state 406. The access terminal finds its own location and finds a subset of access points in its PUZL which are within a pre-determined proximity to the access terminal. Assuming the subset is not empty, the access terminal will periodically search for pilot signals from the access points in the subset.

The access terminal will also search for a pilot signal from an access point from the PUZL if the access terminal is in its power up routine and the channel record matches a PUZL entry. If the acquisition was triggered by an access point in the PUZL, the access terminal will only acquire a signal from such an access point, rather than a stronger pilot signal form another access point not in the PUZL. If a timer expires 416 before the access terminal acquires a pilot signal, it returns to the network determination state 404. Once a pilot signal is acquired 418, the access terminal enters the Synchronization state 408 where it synchronizes itself to the private access point's pilot signal. On the basis of another timer or a an incompatibility between the private access point and the access terminal (sometimes referred to as an out of revision, OOR, event), the access terminal will return 422 to the network determination state 404. If it receives a Sync Message OK signal 420, the access terminal will return to the inactive state 402.

FIG. 5 shows how the access terminal may perform a route update. It transitions from an inactive state 502 to an idle state 504 upon receiving an "activate" command 512. If the access terminal was on the macro network, it will begin using the PUZL search algorithm on entry to this state and will disable it on exit. If it was already using an access point from the PUZL, it will modify its active set maintenance rules that trigger an active set change so that the active set does not change. This causes the access terminal to ignore stronger pilot signals than the ones it is receiving from access points in the PUZL. The active set maintenance rules determine which pilot signal the access terminal should monitor. The pilot channel supervision rule does not change, that is, if the pilot strength of an access point in the PUZL drops below a threshold Tdrop for a time Tdroptimer seconds, the access terminal will indicate that it lost its connection to the network. While in the idle state 504, a timer periodically triggers a location check to update the access terminal's geographic location information and determine whether it should look for a new access point. If the access terminal receives a traffic channel assignment (TCA) 514, it connects to the radio access network using the assigned traffic channel and enteres the connected state 506. In the connected state 506, the radio access network can control the access terminal's behavior. If the connection is closed 516, the access terminal returns to the idle state 504. From either the idle state 504 or the connected state 506, if the access terminal receives a deactivate command 518 or 520, it will return to the inactive state 502.

Advantages include the following. Configuration of authorized private access points on handsets without end-user intervention is enabled though both push (OTAPA) and pull (OTASP) processes. Fast switchover from a macro access point to a private access point without user intervention is possible. A private access point can be searched for efficiently, preserving handset battery life. Unnecessary switchover from a macro access point to a private access point is avoided as access terminals do not need to perform Location/Update or SectorID decoding to identify their own private access point. No modifications are required to the software and configuration of the macro network. Handset chipset makers are not required to expose internal APIs to application vendors, because the existing PUZL system accommodates the geographic location information. New applications are not required to be bundled with handsets. Dynamic addition and removal of subscribers to and from a list of private access points is enabled, as the private access points report their location when powered up. Private access points can be moved around without intervention by users of access terminals.

Although the techniques described above employ the 1xEV-DO air interface standard, the techniques are also applicable to other CDMA and non-CDMA air interface technologies in which an access terminal communicates with a server over a wireless network.

The techniques described herein can be implemented in digital electronic circuitry, or in computer hardware, firmware, software, or in combinations of them. The techniques can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method/ steps of the techniques described herein can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the techniques described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer (e.g., interact with a user interface element, for example, by clicking a button on such a pointing device). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The techniques described herein can be implemented in a distributed computing system that includes a back-end component, e.g., as a data server, and/or a middleware component, e.g., an application server, and/or a front-end component, e.g., a client computer having a graphical user interface and/or a Web browser through which a user can interact with an implementation of the invention, or any combination of such back-end, middleware, or front-end components. The components of the system can be interconnected by any form or medium of digital data communication, e.g., a communication network. Examples of communication networks include a local area network ("LAN") and a wide area network ("WAN"), e.g., the Internet, and include both wired and wireless networks.

The computing system can include clients and servers. A client and server are generally remote from each other and typically interact over a communication network. The relationship of client and server arises by virtue of computer programs running on the respective computers and having a client-server relationship to each other.

Other embodiments are within the scope of the following claims. The techniques described herein can be performed in a different order and still achieve desirable results.

What is claimed is:

1. A method performed on a portable access terminal, comprising:
   receiving information identifying a first geographic location of the portable access terminal;
   identifying a first access point as a preferred access point by comparing, in the portable access terminal, the first geographic location with a second geographic location of the first access point, the second geographic location being stored in the access terminal in a list of preferred access points; and
   accessing a radio access network through the preferred access point if the first geographic location is within a predetermined range of the second geographic location.

2. The method of claim 1, in which the access terminal receives an instruction to add the first access point to the list of preferred access points.

3. The method of claim 2 further comprising receiving the information identifying the first geographic location information of the first access point as part of the instruction to add the first access point to the list of preferred access points.

4. The method of claim 2 in which the instruction is received from an over-the-air parameter administration (OTAPA) server or an over-the-air service provisioning (OTASP) server.

5. The method of claim 1 in which the information identifying the first geographic location of the portable access terminal comprises GPS coordinates of the portable access terminal.

6. The method of claim 1 in which receiving the information identifying the first geographic location of the portable access terminal comprises receiving longitude and latitude coordinates from a GPS satellite or beacon.

7. The method of claim 1 in which receiving the information identifying the first geographic location of the portable access terminal comprises determining longitude and latitude coordinates from a second access point.

8. The method of claim 1 in which receiving the information identifying the first geographic location of the portable access terminal comprises receiving identifying information from a transmitting device and correlating the identifying information to a geographic location.

9. A method performed on an access point, comprising:
   receiving information identifying a first geographic location of the access point;
   communicating the information to a configuration server;
   receiving access information from the configuration server;
   receiving, from a portable access terminal, an indication that the portable access terminal has determined that the first geographic location is within a predetermined range of a second geographic location of the portable access terminal, the indication being based at least in part on comparing, in the access terminal, the second geographic location of the portable access terminal with the first geographic location of the access point; and
   after receiving the indication, providing the portable access terminal access to a radio access network using the access information;
   wherein the first geographic location of the access point is stored in the portable access terminal in a list of access points.

10. The method of claim 9 further comprising receiving access terminal authentication information from the configuration server to identify the access terminal as an authorized access terminal.

11. The method of claim 9 further comprising, after the access point moves to a third geographic location:
    receiving information identifying the third geographic location;
    communicating the third geographic location information to the configuration server;
    receiving new access information from the configuration server; and
    providing the portable access terminal access to the radio access network using the new access information.

12. The method of claim 11 in which the configuration server comprises a plurality of servers.

13. A method comprising:
    receiving geographic location information identifying a geographic location of an access point in a radio access network;
    assigning access information to the access point;
    communicating the access information to the access point; and
    communicating the access information and the geographic location information to a portable access terminal configured to:
       update a list of preferred access points, the list being stored on the portable access terminal and the list comprising geographic locations of preferred access points; and
       compare, in the portable access terminal, the geographic location information of the access point to the geographic location information of the portable access terminal.

14. The method of claim 13 in which a configuration server communicates the access information to the portable access terminal using a backhaul network.

15. The method of claim 13 in which an OTAPA server or an OTASP server communicates the access information and the geographic location information to the portable access terminal using the radio access network.

16. The method of claim 13, further comprising:
    receiving geographic location information identifying a second geographic location of the access point;
    assigning new access information to the access point;
    communicating the new access information to the access point; and
    communicating the new access information and the second geographic location information to the portable access terminal.

17. An apparatus comprising:
    a portable access terminal for accessing a radio access network, the portable access terminal being configured to:
       store, in a memory, a definition of a first access point as a preferred access point;

in the memory, associate a first geographic location with the preferred access point;

receive information identifying a second geographic location of the access terminal;

compare, in the portable access terminal, the second geographic location of the portable access terminal with the first geographic location of the first access point, the first geographic location of the first access point being stored in the portable access terminal in a list of preferred access points; and access a radio access network through the preferred access point if the first geographic location is within a predetermined range of the second geographic location.

18. The apparatus of claim 17 in which the portable access terminal is configured to store the definition of the first access point as a preferred access point in response to receiving an instruction to add the first access point to a list of preferred access points.

19. The apparatus of claim 18 in which the portable access terminal is configured to associate the first geographic location with the preferred access point in response to receiving information identifying the first geographic location of the preferred access point as part of the instruction to add the access point to the list of preferred access points.

20. An apparatus comprising:
an access point for providing access to a radio access network, the access point being configured to:
receive information identifying a first geographic location of the access point;
communicate the first geographic location information to a configuration server;
receive access information from the configuration server;
receive, from a portable access terminal, an indication that the portable access terminal has determined that the first geographic location is within a predetermined range of a second geographic location of the portable access terminal by comparing, in the portable access terminal, the second geographic location of the portable access terminal with the first geographic location of the access point; and
after receiving the indication, provide a portable access terminal access to a radio access network using the access information;
wherein the first geographic location of the access point is stored in the portable access terminal in a list of access points.

21. The apparatus of claim 20 in which the access point is further configured to receive access terminal authentication information from the configuration server to identify the access terminal as an authorized access terminal.

22. The apparatus of claim 20 in which the access point is further configured to, after the access point moves to a third geographic location:
receive information identifying the third geographic location;
communicate the third geographic location information to the configuration server;
receive new access information from the configuration server; and
provide the portable access terminal access to the radio access network using the new access information.

23. An apparatus comprising:
a configuration server for use in a radio access network, the configuration server being configured to:
receive information identifying a geographic location of an access point in the radio access network;
assign access information to the access point;
communicate the access information to the access point; and
communicate the access information and the geographic location information to a portable access terminal configured to:
update a list of preferred access points, the list being stored on the portable access terminal and the list comprising geographic locations of preferred access points; and
compare, in the portable access terminal, the geographic location information of the access point to the geographic location information of the portable access terminal.

24. The apparatus of claim 23 in which the configuration server is configured to:
communicate the access information to the portable access terminal using a backhaul network.

25. The apparatus of claim 23 in which the configuration server is configured to:
cause an OTAPA server or an OTASP server to communicate the access information and the geographic location information to the portable access terminal using the radio access network.

26. The apparatus of claim 23 in which the configuration server is further configured to:
receive information identifying a new geographic location of the access point;
assign new access information to the access point;
communicate the new access information to the access point; and
communicate the new access information and the new geographic location information to the portable access terminal.

27. A non-transitory computer readable medium encoding instructions to cause a portable access terminal in a radio access network to:
store, in a memory, a definition of a first access point as a preferred access point;
in the memory, associate a first geographic location with the preferred access point;
receive information identifying a second geographic location of the portable access terminal;
compare, in the portable access terminal, the second geographic location of the portable access terminal with the first geographic location of the first access point, the first geographic location of the first access point being stored in the portable access terminal in a list of preferred access points; and
access a radio access network through the preferred access point if the first geographic location is within a predetermined range of the second geographic location.

28. The non-transitory medium of claim 27 in which the instructions cause the portable access terminal to:
store the identification of the first access point as a preferred access point in response to receiving an instruction to add the first access point to a list of preferred access points.

29. The non-transitory apparatus of claim 28 in which the instructions cause the portable access terminal to:
associate the first geographic location with the preferred access point in response to receiving information identifying the first geographic location of the preferred access point as part of the instruction to add the first access point to the list of preferred access points.

30. A non-transitory computer readable medium encoding instructions to cause an access point for providing access to a radio access network to:
- receive information identifying a first geographic location of the access point;
- communicate the first geographic location information to a configuration server;
- receive access information from the configuration server;
- receive, from a portable access terminal, an indication that the portable access terminal has determined that the first geographic location is within a predetermined range of a second geographic location of the portable access terminal by comparing, in the portable access terminal, the second geographic location of the portable access terminal with the first geographic location of the access point; and
- after receiving the indication:
  - provide a portable access terminal access to a radio access network using the access information;
- wherein the first geographic location of the access is stored in the portable access terminal in a list of access points.

31. The non-transitory apparatus of claim 30 in which the instructions further cause the access point to receive access terminal authentication information from the configuration server to identify the access terminal as an authorized access terminal.

32. The non-transitory apparatus of claim 30 in which the instructions further cause the access point to, after the access point moves to a new geographic location:
- receive information identifying the new geographic location;
- communicate the new geographic location information to the configuration server;
- receive new access information from the configuration server; and
- provide the portable access terminal access to the radio access network using the new access information.

33. A non-transitory computer readable medium encoding instructions to cause a configuration server in a radio access network to:
- receive information identifying a geographic location of an access point in the radio access network;
- assign access information to the access point;
- communicate the access information to the access point; and
- communicate the access information and the geographic location information to a portable access terminal configured to:
  - update a list of preferred access points, the list being stored on the portable access terminal and the list comprising geographic locations of preferred access points; and
  - compare, in the portable access terminal, the geographic location information of the access point to a geographic location information of the portable access terminal.

34. The non-transitory medium of claim 33 in which the instructions cause the configuration server to:
- communicate the access information to the access point by causing a configuration server to communicate the access information to the portable access terminal using a backhaul network.

35. The non-transitory medium of claim 33 in which the instructions cause the configuration server to:
- communicate the access information and the geographic location information to the portable access terminal by causing an OTAPA server or an OTASP server to communicate the access information and the geographic location information to the portable access terminal using the radio access network.

36. The non-transitory medium of claim 33 in which the instructions cause the configuration server to:
- receive information identifying a new geographic location of the access point;
- assign new access information to the access point;
- communicate the new access information to the access point; and communicate the new access information and the new geographic location information to the portable access terminal.

37. A method performed on a portable access terminal, comprising:
- determine a first global positioning system (GPS) location of the portable access terminal;
- identifying a first private access point as a preferred private access point, the first private access point providing access to a communications network;
- determining that the portable access terminal will access the communications network through the first private access point, the determining comprising:
  - accessing a list stored on the portable access terminal, the list specifying the first private access point as a preferred private access point, wherein the list comprises a second GPS location of the first private access point;
  - comparing, in the portable access terminal, the first GPS location with the second GPS location; and
  - determining, based at least in part on the comparing, that the first GPS location is within a threshold range of the second GPS location; and
- accessing the communications network through the first access point based at least in part on determining that the first GPS location is within a threshold range of the second GPS location.

* * * * *

UNITED STATES PATENT AND TRADEMARK OFFICE
CERTIFICATE OF CORRECTION

PATENT NO. : 8,078,165 B2
APPLICATION NO. : 11/640503
DATED : December 13, 2011
INVENTOR(S) : Amit Mate Page 1 of 1

It is certified that error appears in the above-identified patent and that said Letters Patent is hereby corrected as shown below:

IN THE CLAIMS:

Column 12, Line 61, In Claim 29, delete "apparatus" and insert -- medium --, therefor.

Column 13, Line 22, In Claim 31, delete "apparatus" and insert -- medium --, therefor.

Column 13, Line 28, In Claim 32, delete "apparatus" and insert -- medium --, therefor.

Signed and Sealed this
Tenth Day of April, 2012

David J. Kappos
*Director of the United States Patent and Trademark Office*